United States Patent [19]

Chebowski

[11] 4,019,128
[45] Apr. 19, 1977

[54] INDICATOR LIGHT AND TESTING CIRCUIT
[75] Inventor: Jerome E. Chebowski, Detroit, Mich.
[73] Assignee: Rees, Inc., Fremont, Ind.
[22] Filed: May 8, 1975
[21] Appl. No.: 575,593
[52] U.S. Cl. .................................. 324/21; 324/51; 340/214; 340/252 R
[51] Int. Cl.² ................. G01R 31/02; G01R 31/22; G08B 29/00
[58] Field of Search ............................. 324/20–23, 324/51, 120; 340/213 R, 214, 409, 410, 411, 251, 252 R, 252 P; 315/129, 131, 132, 133; 317/157

[56] References Cited
UNITED STATES PATENTS

| 2,117,313 | 5/1938 | Girardin | 340/251 |
| 2,468,945 | 5/1949 | Sasser | 340/214 |
| 3,244,935 | 4/1966 | Robbins et al. | 340/252 R |
| 3,309,685 | 4/1967 | Manning | 340/213 R |
| 3,840,801 | 10/1974 | Kellog et al. | 324/21 |

Primary Examiner—Gerard R. Strecker
Attorney, Agent, or Firm—Harness, Dickey & Pierce

[57] ABSTRACT

A circuit for simultaneously testing all of the pilot lights or indicator lights on a panel. Each of the pilot lights is associated with a pilot light unit having a transformer and a relay-operated, two-pole switch. Upon the simultaneous introduction of a test current to each of the pilot light units, the relay is energized by the test current to disconnect the pilot light from its normal signal connection and connect the pilot light to receve the test current.

6 Claims, 3 Drawing Figures

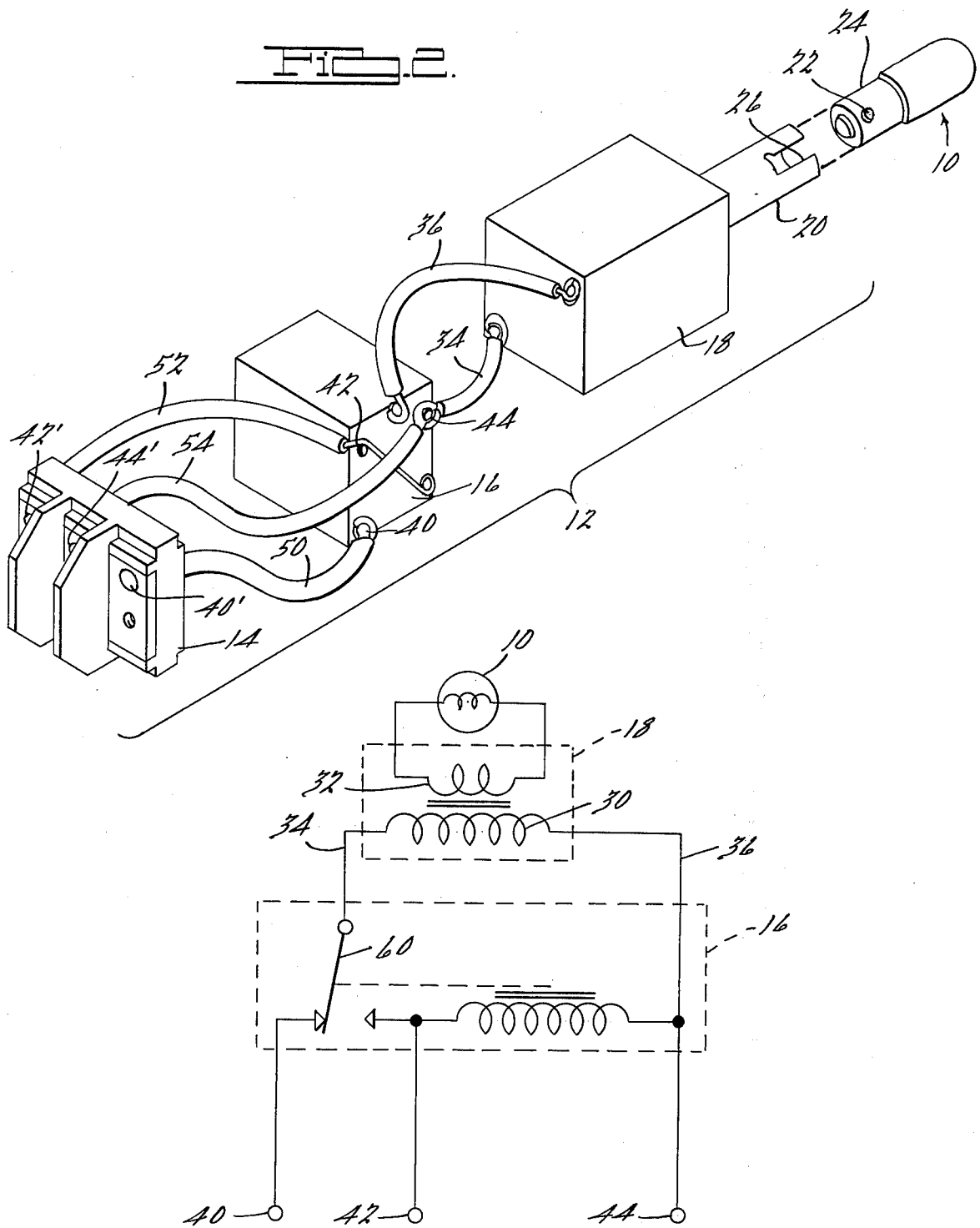

INDICATOR LIGHT AND TESTING CIRCUIT

SUMMARY - BACKGROUND OF THE INVENTION

The present invention relates to pilot light testing circuits for machines or other systems and more particularly to a circuit for simultaneously testing all of the pilot lights on a panel.

On modern machinery there are many applications where multiple indicator or pilot lights are used. The lights normally are energized and thus turned on when the electrically operated machine or system they are in circuit with is put into operation. In that manner, the operator can turn on the machinery at a remote location and by means of the indicator light determine whether or not the machine or system is operating.

If the indicator light does not illuminate when the main power switch is activated to turn on the machine or system, it is difficult to determine whether it is the machine or system which is not operating or it is the indicator light which is burned out. Thus it is advantageous to have a means of rapidly testing the indicator lights to determine whether the lights are operational. It is also advantageous to test many or all of the pilot lights simultaneously by activating a single switch or pushbutton.

There are several known methods of testing pilot or indicator lights. In one system, the lens of each pilot light must be depressed to test the light. This is an inefficient and time consuming operation, however, as frequently large controls panels in modern plants and factories contain hundreds of lights.

Another known testing system involves the use of solid state circuitry utilizing diodes, resistors and capacitors. Although various methods have been developed which utilize a single pushbutton for simultaneously testing a plurality of pilot lights with solid state circuitry, these methods are undesirable for safety reasons. In many of these systems, the light and thus the potential that the operator is exposed to is in the order of sixty volts. Further, solid state testing devices have been known to fail due to extraneous signals causing diode shorting; this in turn produces a dangerous feedback into the control circuit.

Another testing system uses diodes in combination with an internal transformer for each light on the panel and one externally mounted transformer for each panel. Similar to the solid state circuitry systems described above, this system is undesirable because of the possible diode failure feedback that results. Also with this known system, each testing device is typically equipped with four wiring terminals requiring significant expense and labor for installation. The necessity of having an additional transformer for the panel also requires significant additional expenses and installation difficulties.

The present invention is an improvement over known pilot light testing systems. The present invention provides for simultaneous testing of all the pilot or indicator lights on a panel; this eliminates the time consuming and costly individual testing of the lights. When the test button or switch is activated, all of the lights not already turned on due to the operation of the machinery or system in the control circuit, will light up. Thus, the operator instantly is informed of faulty indicator lights.

The present indicator light testing circuit may be activated at any time even when the machinery, equipment or systems are operating. Also, the inventive system and circuit eliminates electrical feedback of the test circuit into the main control circuit.

In the preferred embodiment of the invention, each of the pilot light units includes a transformer and a relay-operated, two pole, switching device. The switching device includes a relay coil and a two-pole switch having a switch contact which is movable upon energization of the coil. The movable contact is connected to one end of the primary winding of the transformer, is normally biased into engagement with one pole, and is movable upon energization of the coil into engagement with a second pole. The pilot light unit has three terminals; a signal terminal, a test terminal and a line terminal. The signal terminal is connected to the normally-connected pole of the relay switch so as to be normally connected to the one end of the primary winding of the transformer; the test terminal is connected in common with the other pole of the relay switch and one end of the relay coil; and the line terminal is connected in common with the other end of the primary winding of the transformer of the other end of the relay coil.

In use, the signal terminal is connected to monitor respective controls and receives a current upon energization of the respective monitored control. The test terminals are connected in common to a test switch to receive a test current upon closure of the test switch. The line terminal is connected to one terminal of a power supply. In the preferred embodiment, the line terminal is connected to the ground terminal of the power supply. Since the movable contact is normally engaged with the signal pole, any energization of the monitored control will provide a current to the primary winding through the relay switch which in turn induces a secondary current to energize the pilot light. Upon closure of the test switch, the relay coil is energized to move the movable contact from the one pole to the other pole. A portion of the test current is provided to the primary coil of the transformer to induce a secondary current which energizes the pilot light. Hence, the closing of the test switch provides several functions. It simultaneously energizes each of the relay coils to simultaneously disconnect all of the signal terminals from the primary winding of the transformers. Also, through energization of the relay coil, it connects the primary winding to the test terminal. Furthermore, the test current simultaneously energizes all of the pilot lights. Importantly, the possibility of feeding test current back through the signal terminal is virtually non-existent since the switch is not connected to receive the test current until after the signal connection is interrupted.

The present invention also utilizes reliable electromechanical relay and transformer units which for purposes of the present invention have many advantages over solid state systems (as described above).

Other objects, features and benefits of the present invention will become apparent from the accompanying drawings and the description and claims contained herein.

BRIEF DESCRIPTION OF THE DRAWINGS

For a better understanding of the invention, reference may be had to the embodiment of the invention shown in the accompanying drawings in which:

FIG. 2 is an exploded perspective view of a pilot light unit in accordance with the present invention; and FIG. 3 illustrates the circuit diagram of the pilot light unit shown in FIG. 2.

DESCRIPTION OF THE PREFERRED EMBODIMENT

Figure 1:
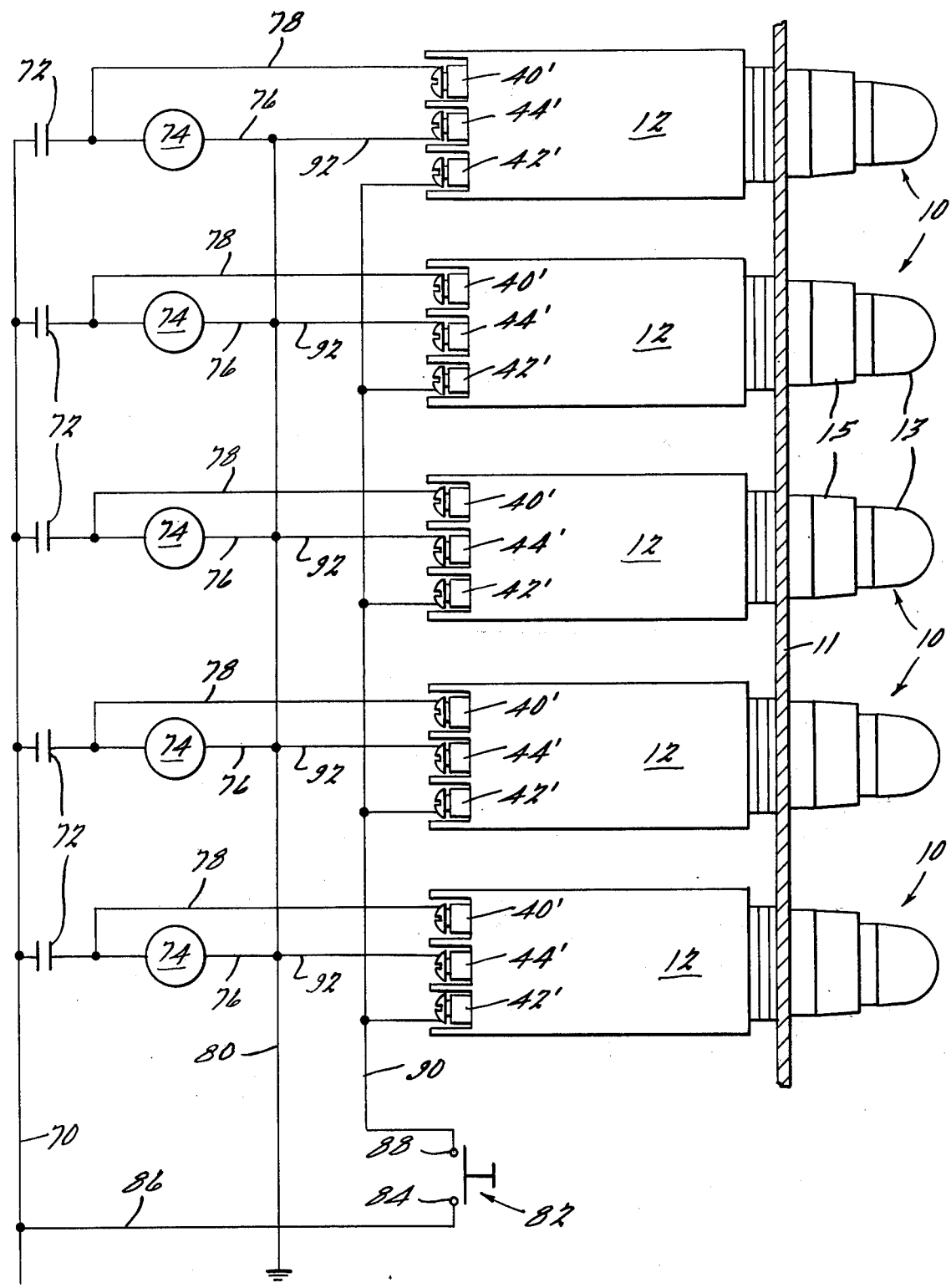
FIG. 1 illustrates an electrical circuit embodying the present invention.

FIG. 1 illustrates an electrical indicator circuit embodying the teaching of the present invention. A plurality of indicator or pilot lights 10 are connected to separate pilot light units 12 which in turn are connected in circuit to a control circuit and a test circuit (described in detail below). The lights 10 are mounted on a panel 11. Five lights 10 and units 12 are illustrated in the drawings, but it is understood that any number can be provided.

As shown in FIG. 2, each pilot light unit 12 comprises a three-terminal connecting plate 14, a relay 16, and a transformer 18. The transformer 18 contains a light holder or socket 20 on one side thereof for insertion of a pilot or indicator light 10. For connection and mating with the holder 20, the lights 10 have appropriate projections or lugs 22 on the base 24 thereof. The projections 22 mate with corresponding J-type slots 26 in the holder 20. A lens 13 is typically positioned over the lights 10 and the lenses 13 are situated in mounting barrels 15 which are attached to the panel 11.

As shown in FIG. 3, each transformer 18 contains a primary winding 30 and a secondary winding 32. The secondary side 32 of the transformer is connected in circuit to indicator light 10. The primary side 30 of the transformer 18 is connected in circuit to the relay 16 by means of conductors 34 and 36. The physical connection of conductors 34 and 36 to the transformers 18 and the relay 16 is pictorially depicted in FIG. 2.

The relay 16 preferably is a relay-operated, two-pole switch having three terminals. The three terminals comprise a signal line terminal 40, a test line terminal 42, and main power line terminal 44. As shown in FIG. 2, the three terminals 40, 42 and 44 are connected to the connecting plate 14 by conductors 50, 52 and 54, respectively. The corresponding terminal connections on the connecting plate 14 are indicated by numerals 40', 42' and 44'. The connecting plate 14 provides for easy and fast installation of the pilot light units 12 to the control and test circuits.

A switch 60 is provided in the relay 16. The switch 60 is normally biased in a position to connect the signal line 40 to the indicator light 10, i.e., when the relay coil is not engergized, the switch 60 is in the position shown. The switch 60 is operable to change the input to the transformer 18 from the control circuit conductor to the test circuit conductor when the coil on the relay 16 is energized by activation of the test button or switch, as described below.

In the control circuit of the preferred embodiment, a line voltage is adapted to energize and illuminate the indicator lights 10 by means of conductor 70 which is connected to an outside power source (not shown). The conductor 70 and thus the line voltage is connected in circuit to each of the signal line terminals 40' of the pilot light units 12 through a switch or a contact means 72. The machines or systems which are connected to the control circuit and adapted to be operated thereby are indicated generally by numeral 74. The machines or systems 74 can be any conventional type that are employed in any plant or factory and frequently are remote from their corresponding switching means 72. The switches 72 are normally positioned on a control panel. The pilot lights 10 also are attached to a panel 11 which is positioned adjacent to or is a part of the control panel. The electrically operated machines or systems indicated generally by numeral 74 are connected to the pilot light units 12 and the main power line terminals 44 thereof by means of conductors 76. The line voltage in conductor 70 is connected in circuit through the switching devices 72 to the signal line terminals 40' of the pilot light units 12 by means of conductors 78.

Thus, it is apparent that when one of the switches 72 is closed or activated, the electrical current from the power source (not shown) flows through the main line terminal 70, the switch 72, the conductor 78, the pilot light unit 12, the conductor 76, and the ground line 80. The current in turn operates the machine or system 74 and energizes the indicator light 10 associated therewith. The indicator light 10 is illuminated whenever the switch 72 is closed and in this manner the operator is given an indication that the machine or system 74 is also turned on and operating. If the indicator lamp does not illuminate when the switch 72 is activated, then the pilot light testing circuit is activated so that the opeator can determine whether it is the machine or system 74 that is not operating or it is the indicator light 10 which is faulty.

To test the pilots lights 10, the operator merely has to activate the pushbutton or switch 82. One terminal 84 of the switch 82 is connected to the main power line conductor 70 by means of conductor 86. The other terminal 88 of switch 82 is connected by means of conductor 90 to the test line terminals 42' of the pilot light units 12. In this manner, when the switch or pushbutton 82 is activated, the line voltage in conductor 70 is connected to all of the pilot light units through conductor 86, switch 82, conductor 90 and test line terminals 42'. The test circuit is completed through the main line terminals 44' and conductors 92 which in turn are connected to the ground line 80.

When the operator decides to test the indicator lights 10 to determine whether or not they are operational, he merely pushes the pushbutton switch 82. This in turn energizes the relay contained in each of the relays 16. The energization of the relay operates the switch 60 which disconnects the signal line which is normally connected in circuit to energize the pilot lights 10 and, connects in circuit the test line to the pilot lights 10. If the lights 10 are not faulty, they will be illuminated when the switch 82 is activated. Since the switch 82 is connected to all of the pilot light units 12, all of the pilot lights 10 on the panel will be tested simultaneously.

The test circuit has three separate functions. When the test switch is activated, (1) the control circuit is disconnected and isolated from the pilot lights 10, (2) the test circuit is connected and activated, and (3) power is directed to all of the pilot lights 10 for illumination thereof. To accomplish all three of the above functions, the test current not only energizes the relay coil, but also energizes the pilot light. Since the test circuit is a separate and distinct circuit from the control circuit and used in a different manner, it is not possible to have any power feedback into the control circuit when the test circuit is operated.

It is also possible when low voltages are used in the system to dispense with transformer 18 and connect the relay 16 directly to the pilot lights 10. Such a system could be used, for example, in automobiles and airplanes.

The pilot light units 12 can comprise completely encased, self-contained miniaturized and compact packages. The pilot light lens and case preferably are made of a high impact poly-carbonate material and the mounting barrel is made of a heavy duty zinc die case material. This combination provides a heavy duty construction having a light weight on the order of only four ounces. The total weight of multiple pilot light installations thus can be reduced by use of the present invention.

The pilot light units of the present invention provide a safe, low-voltage light (on the order of six volts) for exposed front of panel operation or maintenance. This results in prolonged bulb life, on the order of 50,000 hours or more, and low heat dissipation both in front of and behind the panel. Another safety feature with the present invention is the ability to replace the lights and lenses from the front of the panel. In the preferred embodiment, the pilot light unit is also designed to be oil-tight and features captive terminal clamps allowing for easy and effective wiring.

Although the invention has been described with respect to certain embodiments, it is understood that numerous modifications and changes are included within the scope of the invention as defined by the following claims.

I claim:

1. An indicator light circuit comprising
   a plurality of indicator lights,
   transformer means associated with each of said indicator lights, said transformer means having a primary side and a secondary side with said associated indicator light being connected across the secondary of said transformer means,
   relay means connected to the primary side of each of said transformer means for supplying a current to the primary side of said transformer means from either a control terminal or a test terminal, each of said rely means having an internal relay coil and internal switch means including a pair of relay contacts, one of said contacts being connected to said control terminal and the other of said contacts being connected to said test terminal, said internal switch means being adapted to switch from said one contact to said other contact upon the energization of said internal relay coil,
   control circuit means connected to each of said control terminals associated with said plurality of relay means for supplying current to one or more of said plurality of relay means in response to operation of one or more of a corresponding plurality of external contact means,
   test circuit means connected to each of said test terminals associated with said relay means for simultaneously energizing said internal relay coils of each of said relay means in response to operation of a single external test contact means,
   whereby said indicator lights are isolated from said control circuit means and illuminated.

2. The circuit defined in claim 1 wherein the transformer means and relay means are contained in a compact unit.

3. A pilot light circuit comprising
   a plurality of pilot light units, each unit containing a relay-operated switch and a transformer and having three terminals, said relay operated switch being adapted to complete a circuit between a first of said terminals and a second of said terminals in a first normally biased position, and to complete a circuit between said second terminal and a third of said terminals in a second position, said relay operated switch being further adapted to switch from said first position to said second position upon the application of a current to said third terminal,
   a pilot light connected to each pilot light unit, adapted to be energized by a current applied to said first terminal when said relay operated switch is in said first position and to be energized by a current applied to said third terminal when said relay operated switch is in said second position,
   control circuit means connected to said first and second terminals on each pilot light unit, said control circuit means adapted upon activation of one or more of a corresponding plurality of contact means to provide a control current to said first terminals of one or more of said plurality of pilot light units,
   test circuit means connected to said second and third terminals on each pilot light unit, said test circuit means adapted upon activation of a single test contact means to simultaneously provide a current to said third terminals of said plurality of pilot light units to cause said relay-operated switches to electrically disconnect said control circuit means from each of said pilot light units and to energize all of the pilot lights associated with said plurality of pilot light units.

4. The circuit defined in claim 3 wherein said second terminal is connected to the main power line.

5. The circuit defined in claim 3 wherein said second terminal is connected to ground.

6. A pilot light unit comprising,
   a pilot light,
   a transformer connected to said pilot light,
   relay means connected in circuit to said transformer, said relay means having a relay coil, switching means, a signal line terminal, a test line terminal and a main line terminal,
   said signal line and main line terminals adapted to be connected to and energized by a control circuit,
   said test line and main line terminals adapted to be connected to and energized by a test circuit, and
   said switching means normally biased to connect in circuit said signal line terminal with said transformer whereby said pilot light is energized by said control circuit, and movable subject to energization of said relay coil by said test circuit to connect in circuit said test line terminal with said transformer, whereby said pilot light is energized by said test circuit and isolated from said control circuit.

* * * * *